United States Patent
Anzai

(10) Patent No.: US 7,335,992 B2
(45) Date of Patent: Feb. 26, 2008

(54) SEMICONDUCTOR APPARATUS WITH IMPROVED YIELD

(75) Inventor: Kunio Anzai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/090,597

(22) Filed: Mar. 28, 2005

(65) Prior Publication Data

US 2005/0212141 A1  Sep. 29, 2005

(30) Foreign Application Priority Data

Mar. 29, 2004  (JP)  ............................. 2004-095543

(51) Int. Cl.
  H01L 23/48   (2006.01)
  H01L 23/52   (2006.01)
  H01L 29/40   (2006.01)
  H01L 27/10   (2006.01)
  H01L 29/73   (2006.01)

(52) U.S. Cl. ...................... 257/776; 257/207; 257/208; 257/277; 257/700; 257/758; 257/759; 257/760

(58) Field of Classification Search ................ 257/700, 257/759–760, 776, 207–208, 277, 758
See application file for complete search history.

(56) References Cited

U.S. PATENT DOCUMENTS

| | | | | |
|---|---|---|---|---|
| 4,058,800 A | * | 11/1977 | Kikuchi | 365/3 |
| 4,646,266 A | * | 2/1987 | Ovshinsky et al. | 365/105 |
| 5,446,311 A | * | 8/1995 | Ewen et al. | 257/531 |
| 5,920,110 A | * | 7/1999 | Crafts et al. | 257/530 |
| 6,188,095 B1 | * | 2/2001 | Hieke | 257/296 |
| 6,429,474 B1 | * | 8/2002 | Gambino et al. | 257/296 |
| 6,489,689 B2 | * | 12/2002 | Nojiri | 257/786 |
| 6,641,411 B1 | * | 11/2003 | Stoddard et al. | 439/108 |
| 6,696,762 B2 | * | 2/2004 | Keeth | 257/776 |
| 6,787,992 B2 | * | 9/2004 | Chuman et al. | 313/505 |
| 6,861,752 B2 | * | 3/2005 | Kajiyama | 257/758 |
| 6,919,621 B2 | * | 7/2005 | Hsu | 257/666 |
| 6,919,637 B2 | * | 7/2005 | He et al. | 257/758 |
| 7,095,470 B2 | * | 8/2006 | Ohta et al. | 349/141 |
| 2001/0016437 A1 | * | 8/2001 | Hasegawa | 439/67 |
| 2003/0067075 A1 | * | 4/2003 | Fukasawa | 257/758 |
| 2003/0168746 A1 | * | 9/2003 | You | 257/759 |
| 2003/0173674 A1 | * | 9/2003 | Nakamura | 257/758 |
| 2003/0218259 A1 | * | 11/2003 | Chesire et al. | 257/786 |
| 2004/0031004 A1 | * | 2/2004 | Yoshioka | 716/7 |
| 2004/0085292 A1 | * | 5/2004 | Spitzer et al. | 345/156 |
| 2004/0155345 A1 | * | 8/2004 | Sugawara et al. | 257/758 |
| 2005/0064737 A1 | * | 3/2005 | Korsunsky et al. | 439/65 |
| 2005/0174876 A1 | * | 8/2005 | Katoh | 365/232 |

FOREIGN PATENT DOCUMENTS

| EP | 473144 A2 | * | 3/1992 |
|---|---|---|---|
| EP | 476625 A2 | * | 3/1992 |
| JP | 2002-016069 A | | 1/2002 |
| JP | 2003-163267 A | | 6/2003 |

\* cited by examiner

*Primary Examiner*—Ida M. Soward
(74) *Attorney, Agent, or Firm*—Sughrue Mion, PLLC

(57) ABSTRACT

The semiconductor apparatus includes a pad; a first line layer placed immediately beneath the pad; and a lattice-shaped contact being between the pad and the first line layer.

13 Claims, 11 Drawing Sheets

RELATED ART

RELATED ART

SEMICONDUCTOR APPARATUS WITH IMPROVED YIELD

BACKGROUND OF THE INVENTION

1. Field of the Invention

The present invention relates to a semiconductor apparatus and particularly to a semiconductor apparatus including an internal circuit and a pad.

2. Description of Related Art

With rapid advancement of smaller and more sophisticated electronic equipment, more highly integrated semiconductor apparatus is under development. Further, higher manufacturing yield and higher quality are demanded for high integration and high density semiconductor apparatus.

FIG. 10 shows the cross-section of a bonding pad and its vicinity in a conventional multi-layer semiconductor chip. The bonding pad 101 is located in the peripheral part of the semiconductor chip. For example, the bonding pad 101 may be placed in a fill cell placed in the semiconductor chip.

This specification normally uses the term "fill cell" to refer to a cell which does not include a diffusion device such as a transistor and not perform a logical operation. The fill cell may be placed for layout purposes, such as in order to fill the gap of a buffer cell or the like or to connect a ground line or a power supply line to a buffer cell or other cells. In some cases, the fill cell may include a diffusion device as needed.

As shown in FIG. 10, a metal layer 131 lies in the surface of the semiconductor chip. A cover layer 106 covers the metal layer 131. The cover layer 106 has an opening where the metal layer 131 is exposed. The metal layer 131 which is exposed in this opening serves as the bonding pad 101.

Below the metal layer 131, metal layers 132, 133, 134, and 135 are stacked with an interlayer insulating film, not shown, interposed therebetween. The metal layers 132 to 135 serve as line layers constituting an internal circuit or the like of the semiconductor chip.

The bonding pad 101 is connected to a lead frame by wire bonding, for example, so as to electrically connect the internal circuit and an external electrode. Since the wire bonding is formed in the central part of the bonding pad 101, an impact of the bonding reaches below the bonding pad 101. For example, the wire bonding process brings a bonding ball into contact with the bonding pad 101 and applies pressure and supersonic vibration thereon, thereby bonding them together. This process makes an impact on the bonding pad 101.

This impact gives damage to a line and an interlayer insulating film located below the bonding pad 101, causing lower yield. Specifically, it causes problems such as crack of the interlayer insulating film, short-circuit of a pad and a lower layer line, and short-circuit of lower layer lines. Further, if a diffusion device exists below the bonding pad 101, the bonding impact can cause the operating characteristics of the diffusion device to deteriorate.

Furthermore, a wafer inspection process performs probing by bringing a probe into contact with the central part of the bonding pad 101. If the stylus force of the probe is high so as to ensure electrical continuity, the bonding pad 101 receives an impact, which causes the same problems as the bonding. On the other hand, reduction of the number of contacts or the stylus force to suppress the damage in probing results in lower test efficiency and reliability.

To overcome the above problems, Japanese Unexamined Patent Application Publication No. 2002-16069, for example, proposes a structure where a plurality of via holes are arranged in a two-dimensional array between doubled pads. This structure, however, cannot sufficiently reduce the effect of bonding and probing. For example, if the metal layers 131 and 132 are doubled pads, the impact of bonding or the like on the metal layer 133 placed below can be reduced to a certain degree; however, the above problems can still occur when the metal layer is made of a soft material such as Al or the bonding or probing force is large.

On the other hand, as a chip size becomes smaller, a pitch between pads decreases and a pad size is also becomes smaller. To meet a demand for smaller pitches, Japanese Unexamined Patent Application Publication No. 2003-163267, for example, proposes a semiconductor apparatus having pads arranged in a staggered pattern in the peripheral part of a semiconductor chip.

FIGS. 11A and 11B are top views illustrating the bonding pads arranged in a staggered pattern and their vicinity. In FIGS. 11A and 11B, bonding pads 101a, 101b, and 101c are located in the outer side of the semiconductor chip. They are electrically connected to an internal circuit by lead-in lines 111a, 111b, and 111c, respectively. Further, bonding pads 112a, 112b, and 112c are located in the inner side of the semiconductor chip and electrically connected to the internal circuit by lead-in lines 113a, 113b, and 113c, respectively.

A bonding wire or the like is connected to a bonding position 114 in the central part of the bonding pad 101b, thereby electrically connecting an external electrode and the internal circuit of the semiconductor chip.

FIG. 11A illustrates the case of forming the bonding pads 101a to 10c, the lead-in lines 111a to 111c, the bonding pads 112a to 112c, and the lead-in lines 113a to 113c in the same layer. In this case, it is necessary to form the lead-in lines 111a to 111c so as not to touch the bonding pads 112a to 112c. Thus, the width of the lead-in lines 111a to 111c is limited by the position, shape and so on of the bonding pads 112a to 112c. Therefore, as the pitch of the bonding pads 112a to 112c decreases, the width of the lead-in lines 111a to 111c decreases accordingly. If supplying power from the bonding pad 101, since the power supply capacity is proportional to the width of the lead-in line, the decrease in the width of the lead-in line leads to a decrease in the power supply capacity. If the lead-in line is used to supply an input/output signal instead of power, signal degradation occurs.

FIG. 11B illustrates the case of forming the lead-in lines 111a to 111c in a layer lower than the bonding pads 112a to 112c. Since the lead-in lines 111a to 111c and the bonding pads 112a to 112c are formed in different layers, it is possible to increase the width of the lead-in lines 111a to 111c without the limitation of the bonding pads 112a to 112c. However, since the lead-in lines 111a to 111c are not formed in the top layer and the lower layer is thinner than the top layer, the power supply capacity can decrease even if the lead-in lines 111a to 111c are wide.

As described above, the present invention has recognized that conventional semiconductor apparatus have the problems that yield decreases due to an impact of bonding and probing if an internal circuit exists below a pad, and that power supply voltage drops or input/output signal deteriorates due to pad arrangement.

SUMMARY OF THE INVENTION

According to one aspect of the present invention, there is provided a semiconductor apparatus which includes a pad; a first line layer placed immediately beneath the pad; and a lattice-shaped contact being between the pad and the first line layer. The lattice-shaped contact can reduce an impact of bonding and probing on the pad, thereby preventing internal circuit breakdown and improving yield.

The present invention provides a semiconductor apparatus that effectively reduces an impact of bonding and probing and thus improves yield.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
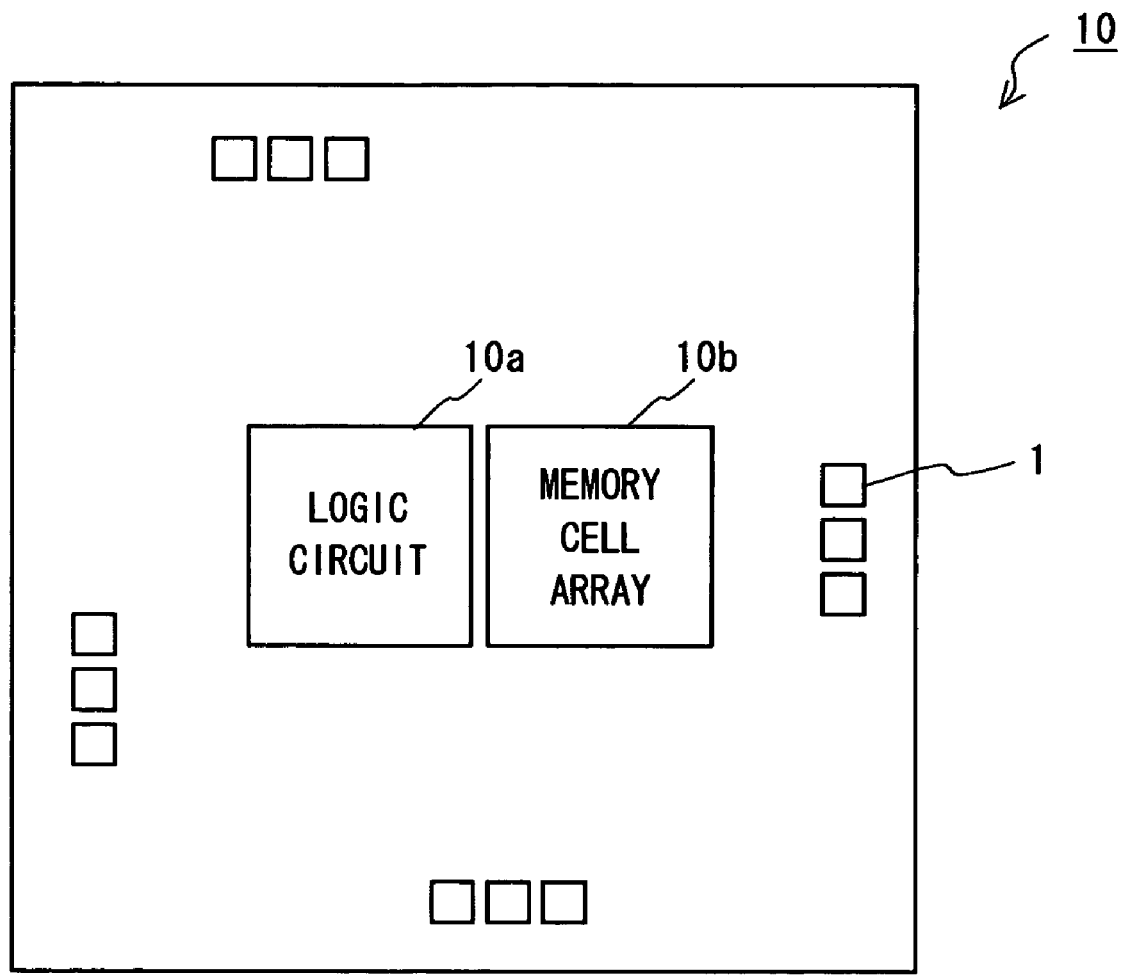
FIG. 1 is a top view of a semiconductor apparatus of the invention.

A semiconductor apparatus of a first embodiment of the invention is described hereinafter with reference to FIGS. 1 to 4. The semiconductor apparatus of this embodiment places a line layer between an internal circuit and a pad in the area where the internal circuit and the pad do not overlap. FIG. 1 is a top view of a semiconductor chip 10, which is the semiconductor apparatus of this embodiment. Bonding pads 1 are arranged in a row in the peripheral part of the semiconductor chip 10. In this example, a logic circuit 10a and a memory cell array 10b are placed in the central part of the semiconductor chip 10. The lines for connecting the logic circuit 10a, the memory cell array 10b, and the bonding pads 1 are not illustrated in FIG. 1. A buffer circuit such as an input/output circuit and a power supply circuit is placed in the vicinity of the bonding pads 1.

This specification uses the term "internal circuit" to refer to a circuit that includes the logic circuit 10a, the memory cell array 10b, and the buffer circuit. The internal circuit is composed of lines, which includes multi-layer lines, and/or diffusion devices, and so on.

The bonding pad 1 is electrically connected to an external electrode by wire bonding or the like in an assembly process, for example, thereby electrically connecting the internal circuit and the external electrode. Further, in an inspection process, the bonding pad 1 may be used for probing by bringing a probe into contact with the bonding pad 1.

It is also possible to place a stud bump (gold bump) or bump (metal bump), which is formed by electrolytic plating and evaporation, on the bonding pad 1 to make a flip-chip connection with the external electrode. Though the bonding pads 1 are arranged in a line in the peripheral part of the semiconductor chip 10 in FIG. 1, they may be arranged in a plurality of lines, in a zigzag or staggered pattern, or in other patterns. In a staggered arrangement, for example, the bonding pads 1 are arranged in such a way that a first pad line (outer pad line) and a second pad line (inner pad line) lie in parallel, and the interval area between each pad of the first pad line exists next to each pad of the second pad line. The staggered arrangement achieves a smaller pitch between pads.

The memory cell array 10b is, for example, a nonvolatile memory such as Electrically Erasable Programmable ROM (EEPROM) or Erasable Programmable Read Only Memory (EPROM). The nonvolatile memory generally requires separate testing from logic testing. An increase in the number of times of testing results in a higher probing impact on the pad. Hence, the effect of applying this invention is high. For example, the semiconductor chip 10 including the logic circuit 10a and the memory cell array 10b as shown in FIG. 1 requires at least two kinds of tests for the logic circuit 10a and the memory cell array 10b, and probing is performed each time. Further, for the semiconductor chip 10 which requires higher reliability, the test on the logic circuit 10a consists of a low-temperature test, a room-temperature test, and a high-temperature test, and further the test on the memory cell array is performed.

Figure 2:
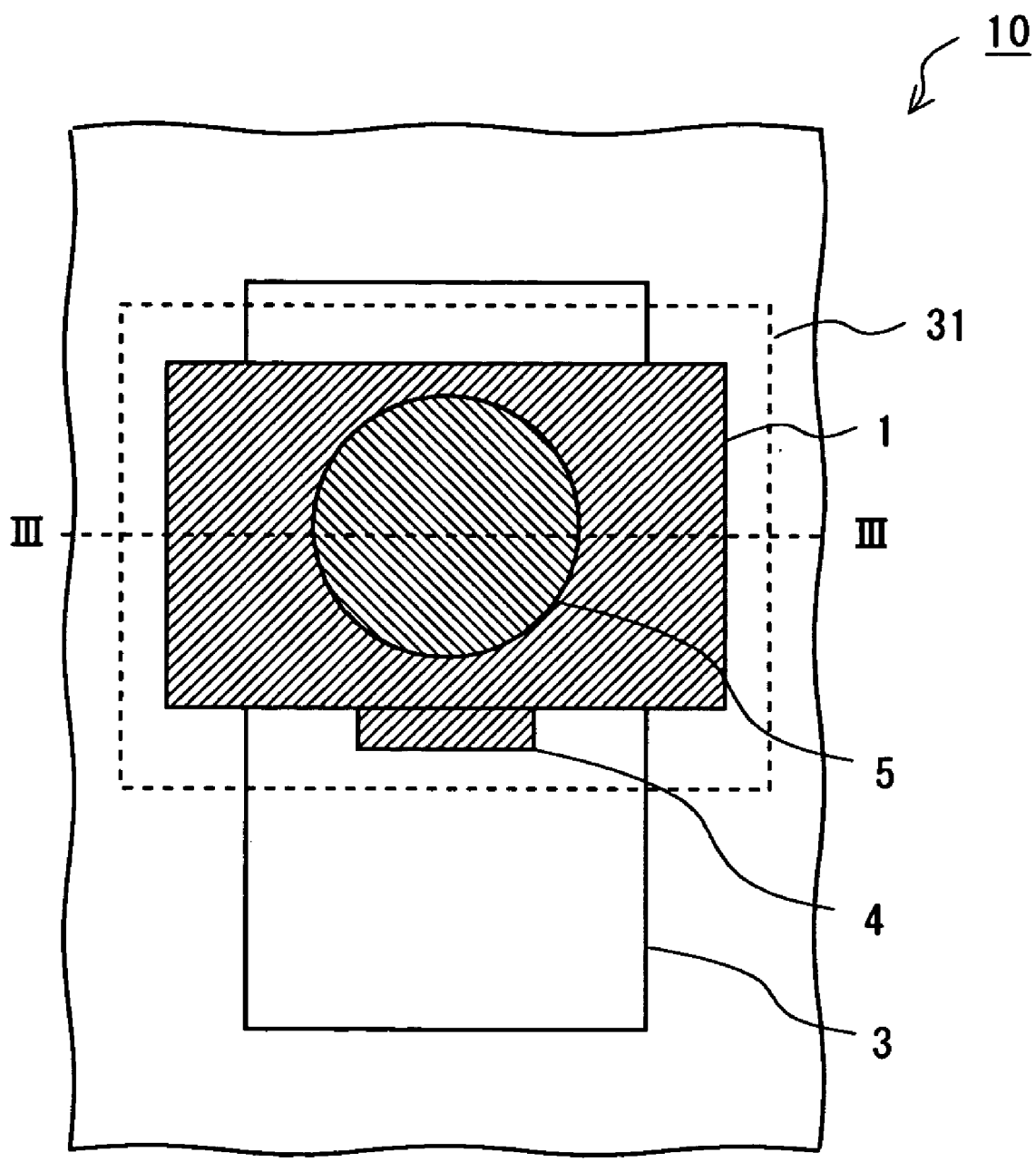
FIG. 2 is an enlarged top view of a bonding pad and its vicinity of a semiconductor apparatus of the invention.

FIG. 2 is an enlarged top view illustrating the bonding pad 1 and its vicinity of the semiconductor apparatus of this embodiment. The bonding pad 1 lies above the internal circuit 3 of the semiconductor chip 10 and electrically connected to the internal circuit 3 through a connecting portion 4. The bonding pad 1 is the exposed part of the metal layer 31, which is the top layer of the internal circuit 3. For example, the bonding pad 1 is substantially square-shaped with one side 50 to 80 μm. The connecting portion 4 may be placed in the exposed part of the metal layer 31 or covered with a cover layer 6, which is not illustrated in FIG. 2.

The central part of the bonding pad 1 serves as a bonding position 5. The bonding position 5 is used also as a position for probing. For example, a bonding ball is bonded to the bonding position 5 when bonding, and a probe is touched to the bonding position 5 when probing.

Figure 3:
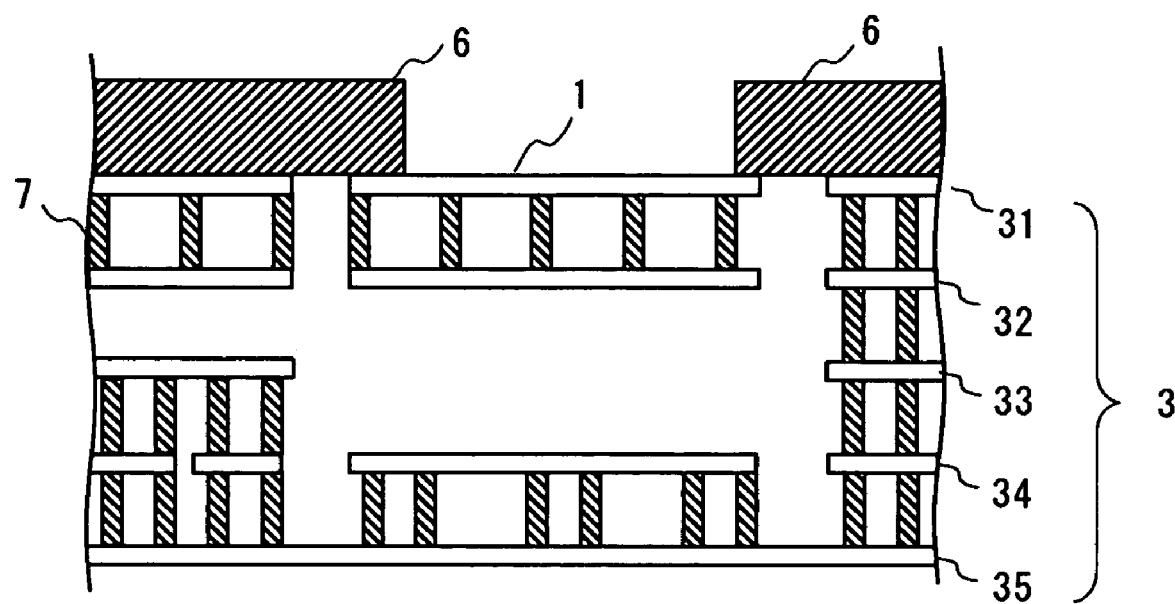
FIG. 3 is an enlarged cross-sectional view of a bonding pad and its vicinity of a semiconductor apparatus of the invention.

FIG. 3 is a cross-sectional view along line III-III of FIG. 2. The interlayer insulating film or the like is not illustrated in FIG. 3 for simplifying the description. The metal layer is formed in the shape of the interlayer insulating film planarized by Chemical Mechanical Polishing (CMP) process. As shown in FIG. 3, the semiconductor apparatus of this embodiment has a multi-layer structure. The multi-structure may consist of four to six layers or even seven or more layers. The bottom layer may be a diffusion layer having a diffusion device or the like.

The metal layer 31 lies on the surface of the semiconductor chip 10, and the cover layer 6 covers the metal layer 31. The cover layer 6 is made of polyimide, for example, and it is also called a coating layer and a surface protection layer.

The cover layer 6 has an opening where the metal layer 31 is exposed. The metal layer 31 exposed in this opening serves as the bonding pad 1. Below the metal layer 31, metal layers 32, 33, 34, and 35 are stacked with an interlayer insulating film, not shown, interposed therebetween. The metal layers 32 to 35 serve as line layers constituting an internal circuit or the like of the semiconductor chip 10. The metal layer 31 may also serve as a line layer.

The metal layer 31 is made of aluminum (Al) or copper (Cu), for example. The bonding pad 1 is formed of the metal layer 31. An alloy layer is formed on a bonded surface of a ball portion for bonding the bonding pad land a bonding wire. If, for example, a bonding ball is made of gold (Au) and the metal layer 31 is made of Al, the alloy layer is made of an alloy of Au and Al so as to enhance adhesion.

In this case, by high-temperature processing such as annealing, a void occurring when the Al contained in the metal layer 31 moves to the alloy layer causes a void to exist in the boundary area between the alloy layer and the metal layer 31, which reduces the adhesion between the bonding ball and the bonding pad 1. In order to prevent the void from occurring, an Au layer formed by gold plating or an Au layer and a barrier metal layer may be deposited on the surface of the metal layer 31 serving as the bonding pad 1.

The metal layer 31 serving as the bonding pad 1 is electrically connected to the metal layer 32 placed below through a plurality of contacts 7. It is thereby possible to prevent the metal layer 31 in the area of the bonding pad 1 from being stripped when bonding and reduce an impact of bonding and probing.

Figure 4:
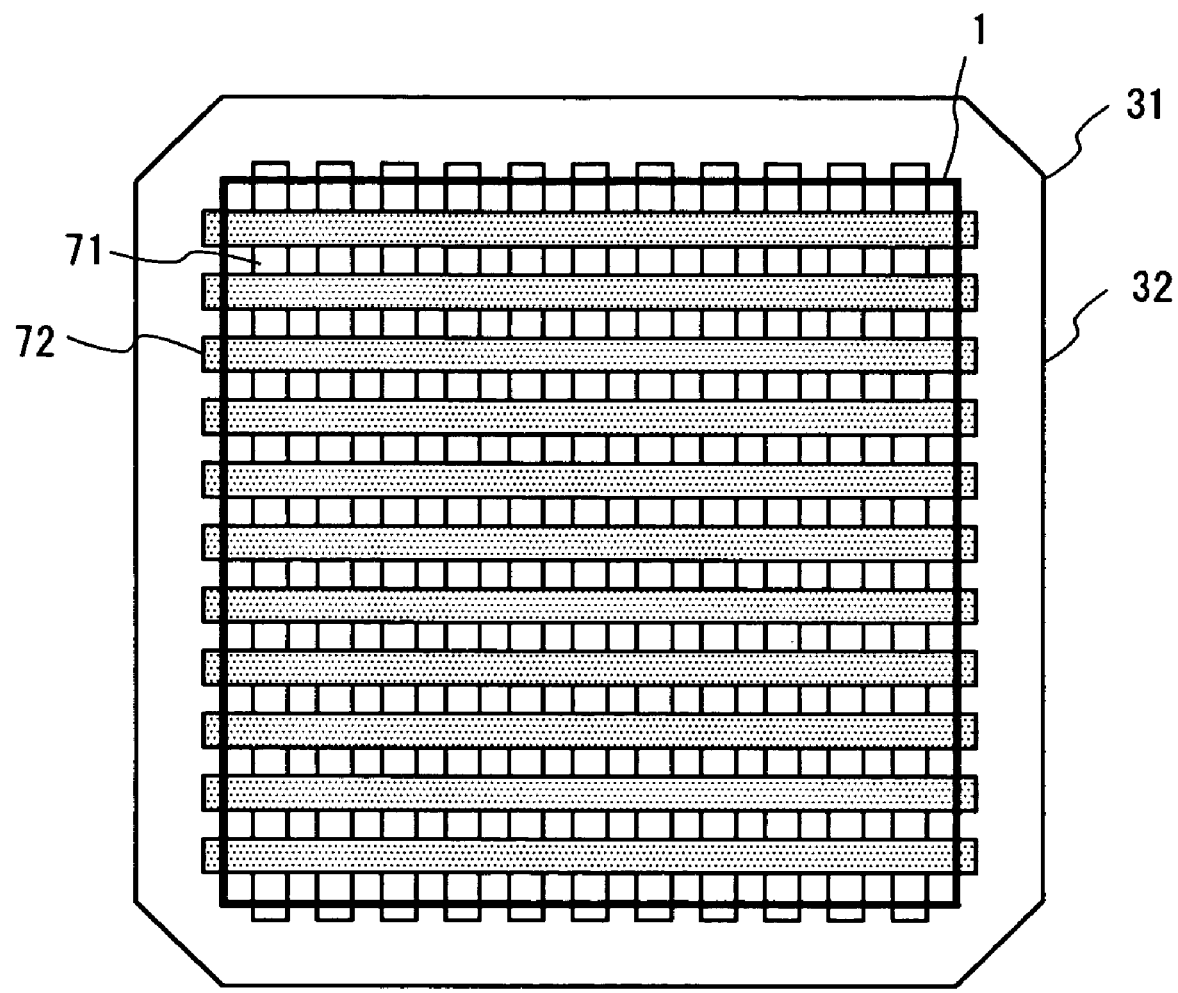
FIG. 4 is an enlarged top view of a bonding pad and its vicinity of a semiconductor apparatus of the invention.

FIG. 4 illustrates the structure of the contact 7. The contact 7 is composed of wall-shaped via holes 71 and 72 orthogonal to each other, which form a lattice pattern when viewed from above. The via holes 71 (first conductor) are linear and parallel to each other and the via hole 72 (second conductor) are also linear and parallel to each other. The via holes 71 are placed on the metal layer 32. The via holes 72 cross the via holes 71 and are placed thereon. The metal layer 31 is placed on the via holes 72. This structure prevents stripping of the metal layer 31 and effectively reduces an impact of bonding. The via holes are not necessarily lattice-shaped, but may be stripe-shaped or dot-shaped.

Though the metal layer 31 is divided at both ends of the bonding pad 1 in FIG. 3, the connecting portion 4 may be placed there. The connecting portion 4 may be placed also in the position where the metal layer 32 is divided in the same way. Placing the connecting portions 4 in both the metal layers 31 and 32 allows reducing the resistance of the lead-in line, thus achieving a low current loss. The connecting portion 4 may have a contact to make a connection with the metal layer 33 or the like.

As shown in FIG. 3, the internal circuit of the semiconductor chip 10 exists in the semiconductor area below the bonding pad 1. The internal circuit is a power supply line or an input/output line, for example. This structure places the bonding pad 1 above the internal circuit, thereby avoiding an increase in the chip size.

This embodiment does not form the metal layer 33, which is the second layer, on the second interlayer insulating film so that the second interlayer insulating film and the third interlayer insulating film make up a thick interlayer insulating film. Specifically, the metal layer 33 is not formed in the area overlapping with the bonding pad 1, but formed in the area not overlapping with the bonding pad 1. Presence of the layer without the line layer underneath the bonding pad 1 allows reducing an impact of bonding and probing on the internal circuit, thereby lowering a risk of breaking the internal circuit. Though the layer without the line layer may be any layer as long as it is below the bonding pad 1, it is preferably the layer just below the bonding pad 1.

Even if the bonding pad 1 is not configured to have a doubled structure with contacts in a lattice pattern as shown in FIGS. 3 and 4, it is possible to reduce an impact of bonding and probing by forming the layer without the line layer as described above.

As described in the foregoing, the semiconductor apparatus of the first embodiment of the invention places the internal circuit in the semiconductor area below the bonding pad 1, thereby reducing the chip size. Further, it has the bonding pad 2 having a doubled structure with a plurality of contacts, thus reducing an impact of bonding or probing. In addition, it has no line layer in the layer immediately below the bonding pad 1, thus preventing the internal circuit from being broken during bonding or probing. It is thereby possible to reduce the yield of the semiconductor apparatus.

Second Embodiment

A semiconductor apparatus of a second embodiment of the invention is described hereinafter with reference to FIGS. 5 to 8. In this semiconductor apparatus, a pad overlaps across a plurality of cells, and a line layer are formed in the area different from the area where the internal circuit of one cell and the pad overlap. The basic structure of the semiconductor apparatus of this embodiment is the same as that of the semiconductor chip 10 of FIG. 1 and thus not described here.

Figure 5:
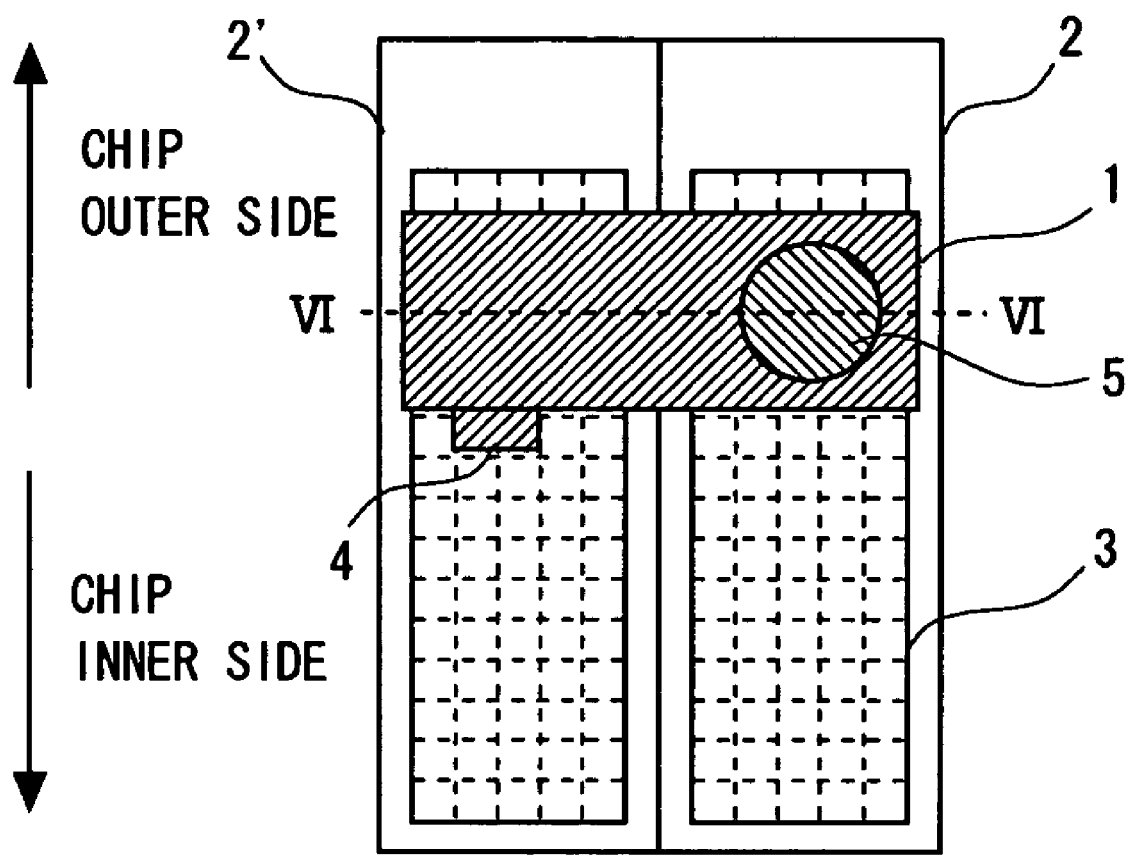
FIG. 5 is an enlarged top view of a bonding pad and its vicinity of a semiconductor apparatus of the invention.

FIG. 5 is an enlarged top view illustrating the bonding pad 1 and its vicinity of the semiconductor apparatus of this embodiment. In FIG. 5, the same reference symbols as in FIG. 2 designate the same or similar elements and redundant description is omitted.

As shown in FIG. 5, this embodiment places a fill cell 2 and a buffer cell 2' adjacent to each other. The buffer cell 2' has the internal circuit 3 such as a power supply circuit or an input/output circuit. In the buffer cell 2', the internal circuit 3 preferably extends to the layer just below the bonding pad 1.

The bonding pad 1 lies so as to overlap across both the fill cell 2 and the buffer cell 2'. The part of the bonding pad 1 overlapping with the buffer cell 2' is electrically connected to the internal circuit of the buffer cell 2' through the connecting portion 4. The part of the bonding pad 1 overlapping with the fill cell 2 has the bonding position 5.

The fill cell 2 and the buffer cell 2' may be not adjacent but separated from each other; further, another cell may exist therebetween. However, the fill cell 2 and the buffer cell 2' are preferably next to each other in order to effectively connect the buffer cell 2' and an external electrode or the like bonded together.

Figure 6:
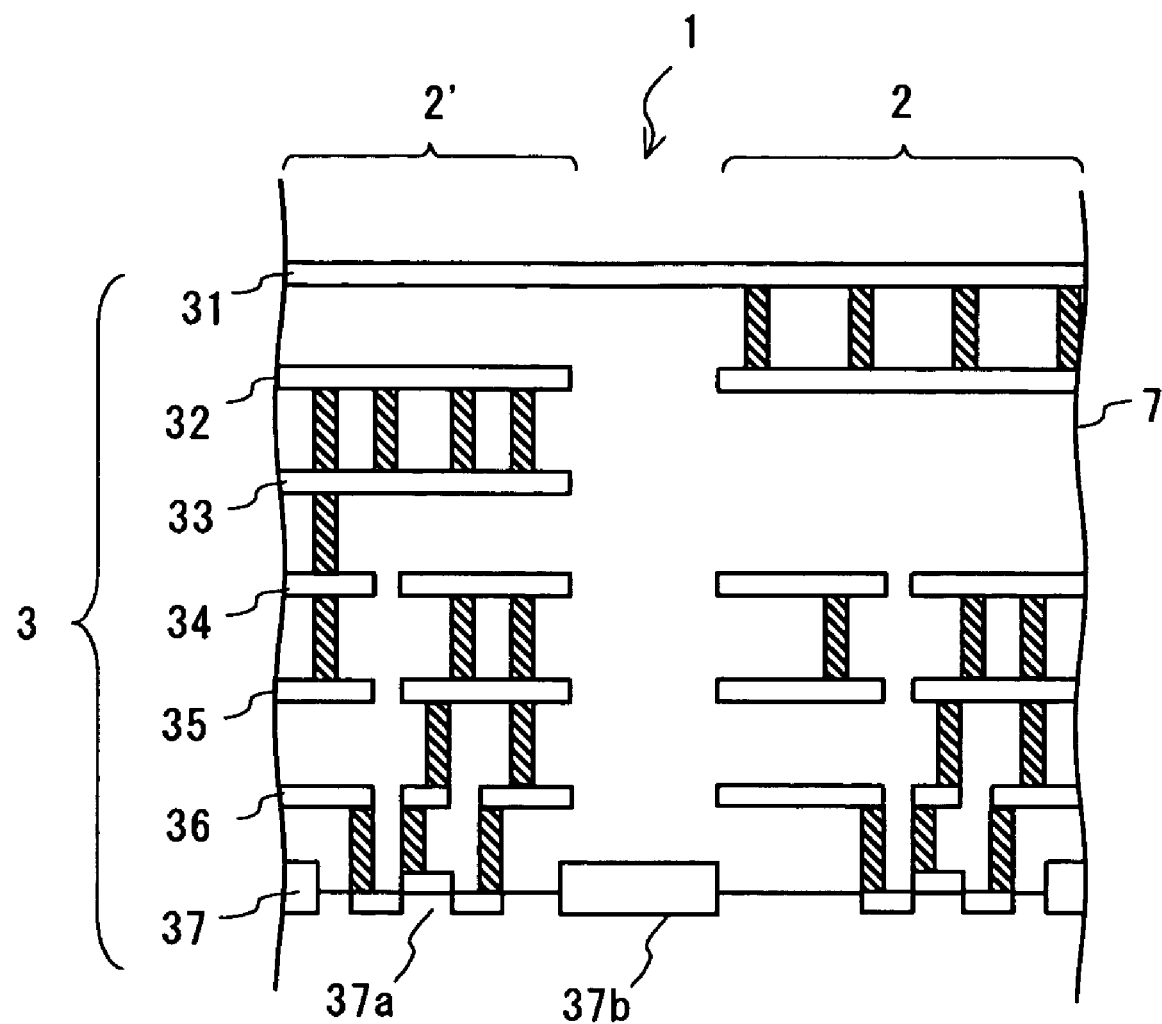
FIG. 6 is an enlarged cross-sectional view of a bonding pad and its vicinity of a semiconductor apparatus of the invention.

FIG. 6 is a cross-sectional view along line VI-VI of FIG. 5. In FIG. 6, the same reference symbols as in FIG. 3 designate the same or similar elements and redundant description is omitted.

As shown in FIG. 6, the metal layer 31 is formed so as to overlap across the fill cell 2 and the buffer cell 2'. The metal layer 32 is divided in the area between the fill cell 2 and the buffer cell 2'. The metal layers 31 and 32 in the fill cell 2 are electrically connected by the contact 7, which is composed of lattice-shaped contacts as shown in FIG. 4. This structure allows reducing an impact of bonding and probing.

A diffusion layer 37 lies below the metal layer 36. The diffusion layer 37 has a diffusion device 37a such as a transistor and a device separating area 37b. The diffusion device 37a may be placed also in the lower part of the fill cell 2, as shown in FIG. 6.

Since the fill cell 2 does not have the metal layer 33, which is the second layer just like the structure of FIG. 3, it is possible to reduce an impact of bonding and probing and prevent breaking of the internal circuit. Further, in this embodiment, the buffer cell 2' includes a buffer circuit composed of all the layers other than the metal layer 31 serving as the bonding pad 1, which are, the metal layers 32 to 36 and the diffusion layer 37. It is thereby possible to place the circuit that needs to use all the layers below the metal layer 31, such as a power supply circuit or a high-speed input/output circuit, beneath the bonding pad 1.

Figure 7A:
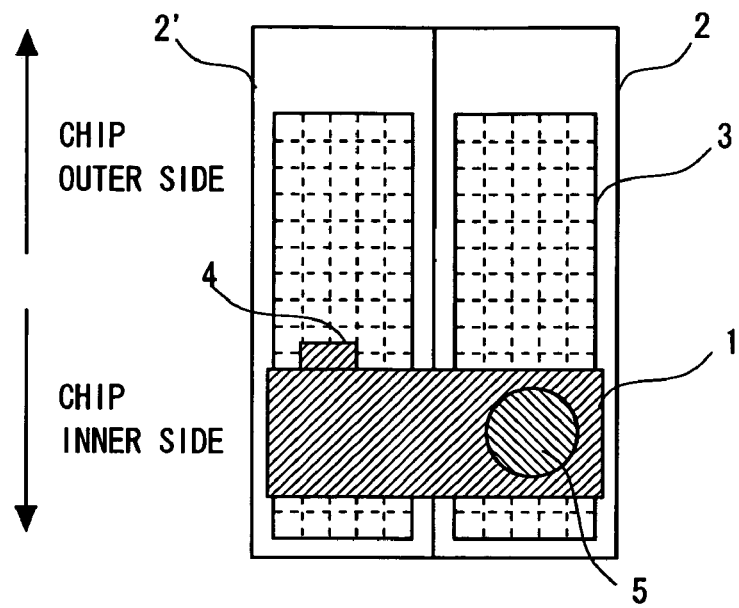
FIG. 7A is an enlarged top view of a bonding pad and its vicinity of a semiconductor apparatus of the invention.
Figure 7B:
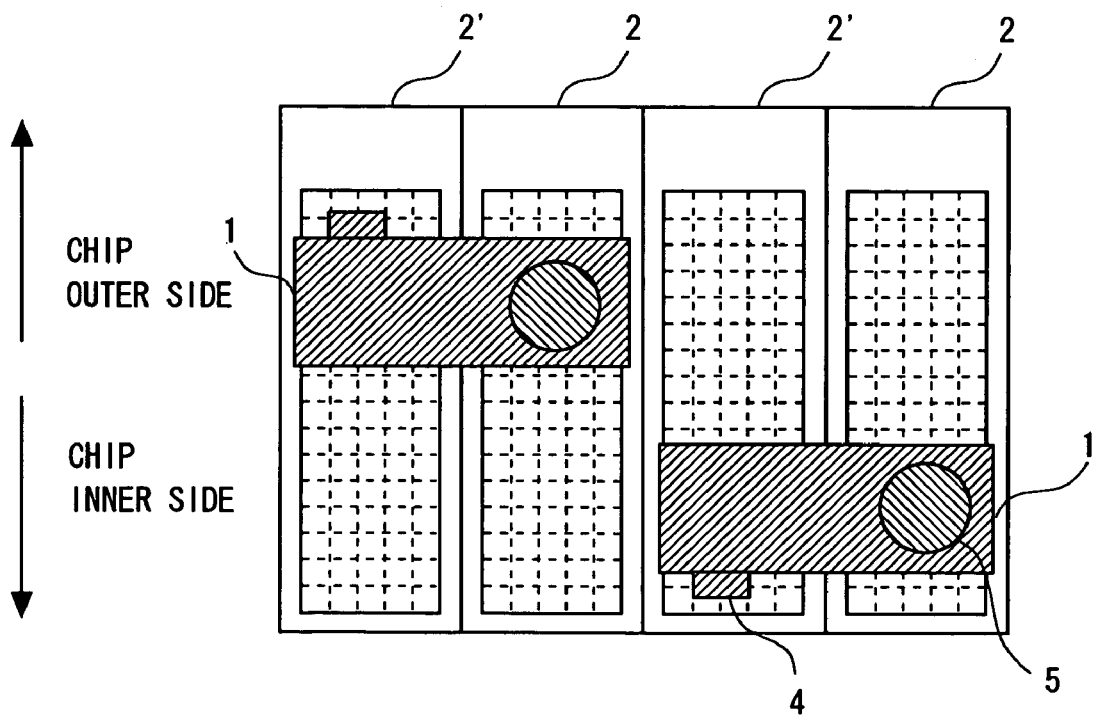
FIG. 7B is an enlarged top view of a bonding pad and its vicinity of a semiconductor apparatus of the invention.
Figure 8A:
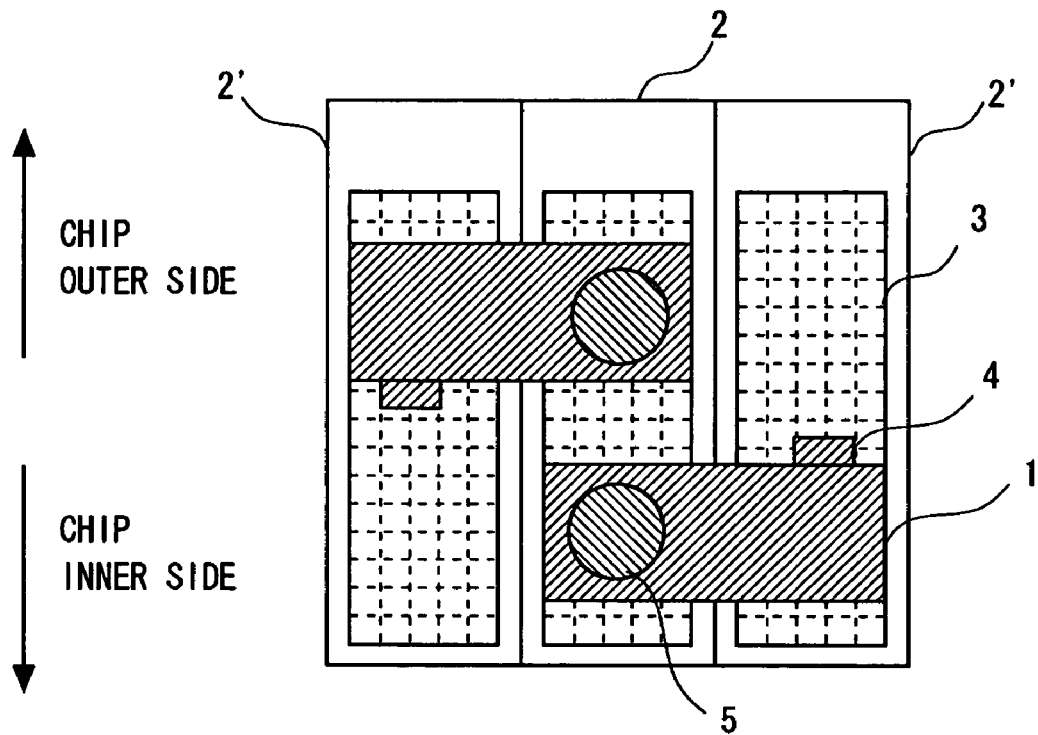
FIG. 8A is an enlarged top view of a bonding pad and its vicinity of a semiconductor apparatus of the invention.
Figure 8B:
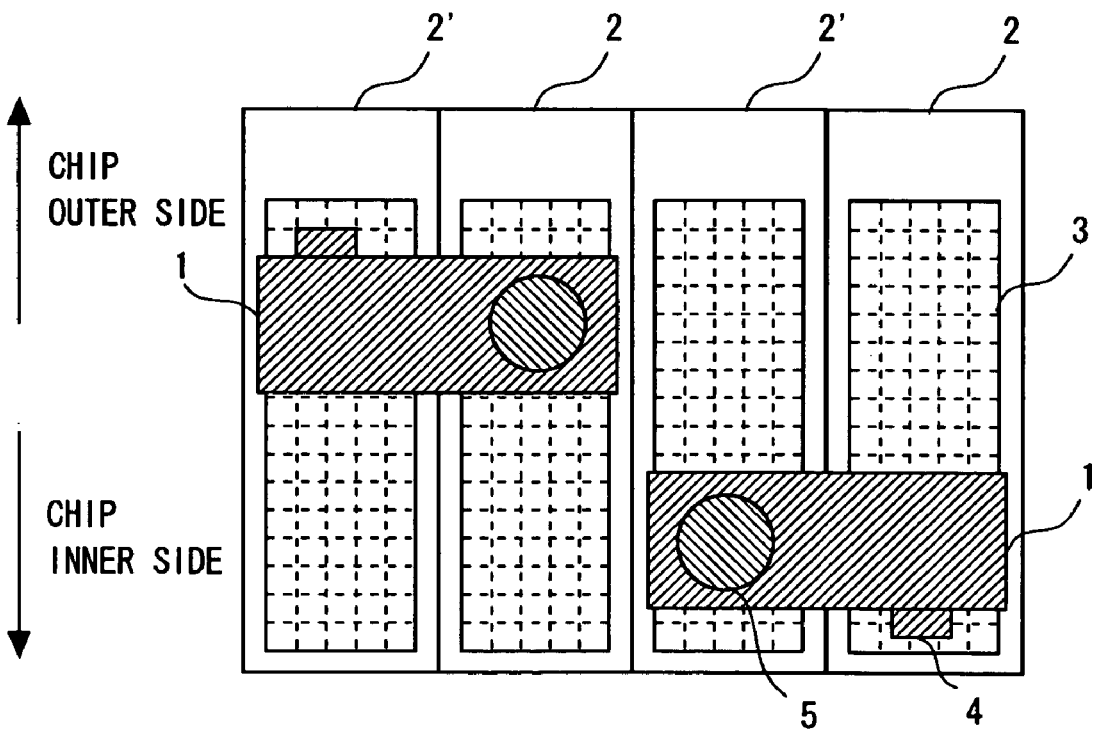
FIG. 8B is an enlarged top view of a bonding pad and its vicinity of a semiconductor apparatus of the invention.

The position of the bonding pad 1 in the fill cell 2 and the buffer cell 2' and the position of the connecting portion 4 in the bonding pad 1 are not limited to those illustrated in FIG. 5. For example, as shown in FIG. 7A, the connecting portion 4 may be placed in the bonding pad 1 at the outer side of the semiconductor chip. Alternatively, as shown in FIG. 7B where two pairs of the fill cell 2 and the buffer cell 2' are placed next to each other, the connecting portion 4 in one bonding pad 1 may be placed at the outer side of the semiconductor chip, and the connecting portion 4 in the other bonding pad 1 may be placed at the inner side of the semiconductor chip. Further, as shown in FIG. 8A where the buffer cells 2' are placed in both sides of the fill cell 2, two bonding pads 1 each may lie across each pair of the fill cell 2 and the buffer cell 2'. As shown in FIG. 8B, each connecting portion 4 may be placed in the opposite position from those in the FIG. 8A.

As described in the forgoing, the semiconductor apparatus of the second embodiment places the bonding pad so as to overlap with a plurality of cells, and places the bonding position in the part of the bonding pad at one cell and places the connecting portion with the internal circuit in the part of the bonding pad at the other cell. It is thereby possible to reduce the effect of an impact of bonding and probing and use all the layers below the bonding pad as the internal circuit in the cell having the connecting portion.

Third Embodiment

A semiconductor apparatus of a third embodiment of the invention is described hereinafter with reference to FIGS. 9A and 9B. The semiconductor apparatus of this embodiment further reduces the line resistance of a lead-in line connecting the pad and the internal circuit. The basic structure of this semiconductor apparatus is the same as that illustrated in FIGS. 1 to 4 and FIGS. 5 to 8, and thus not described here. Since the first and the second embodiments impose a restriction on the area to form the line layers and thus on the lead-in lines, it is possible to obtain a higher effect by applying this embodiment to the semiconductor apparatus of the first and the second embodiments, for example.

Figure 9A:
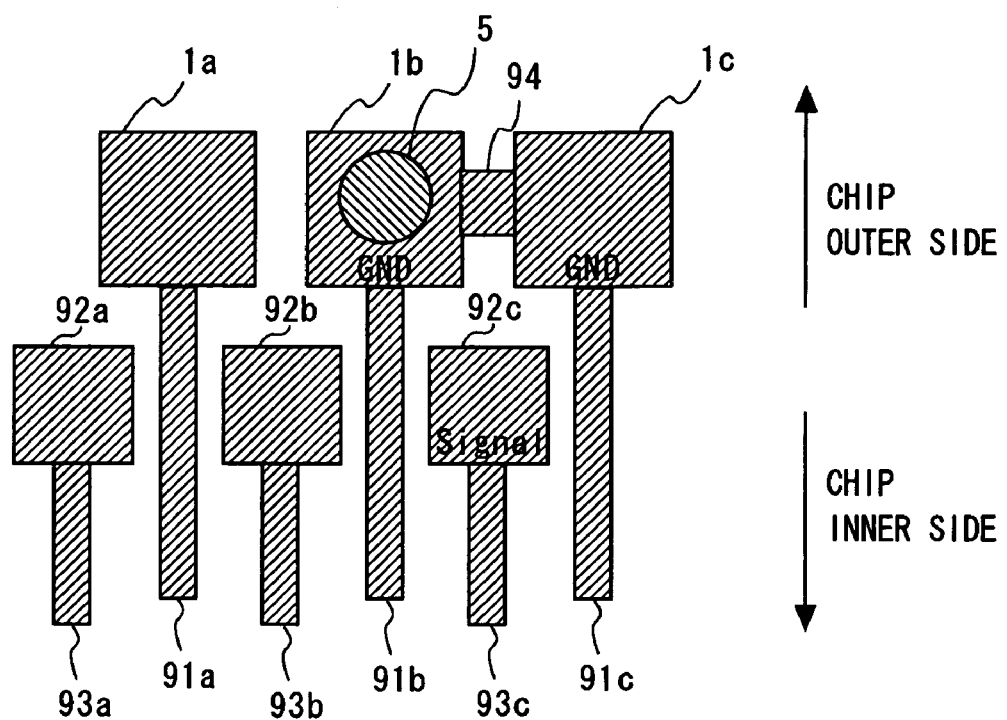
FIG. 9A is an enlarged top view of a bonding pad and its vicinity of a semiconductor apparatus of the invention.
Figure 9B:
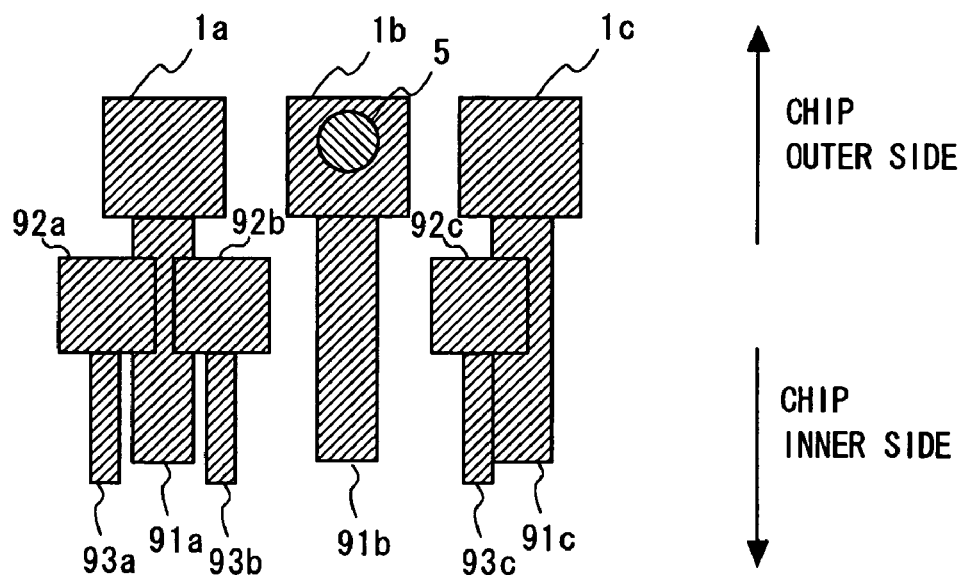
FIG. 9B is an enlarged top view of a bonding pad and its vicinity of a semiconductor apparatus of the invention.
Figure 10:
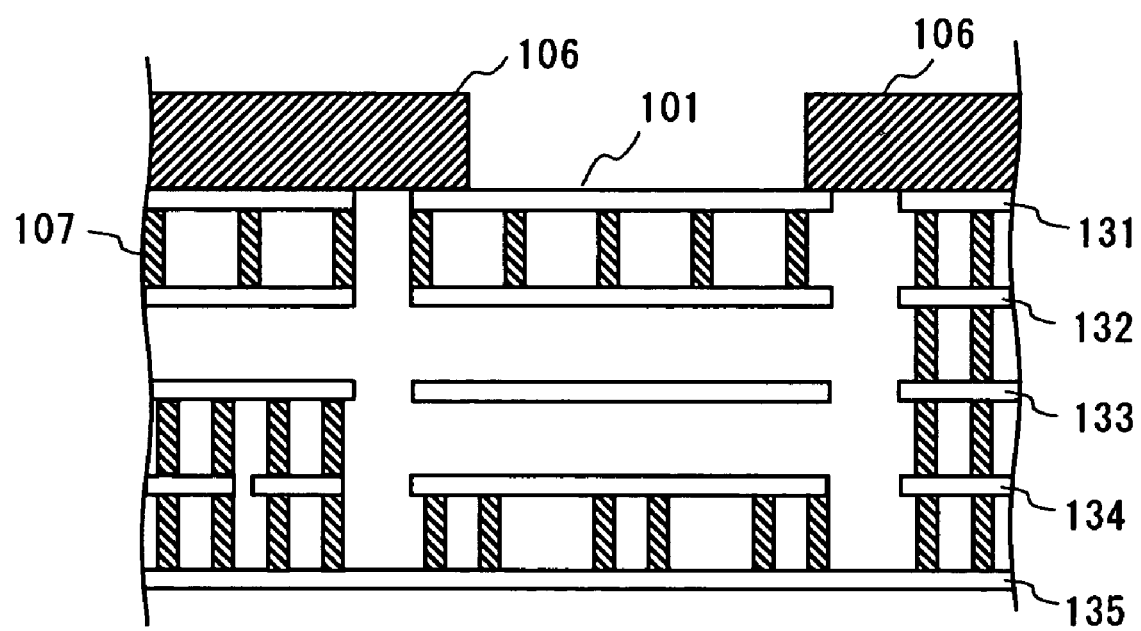
FIG. 10 is a cross-sectional view of a conventional semiconductor apparatus.
Figure 11A:
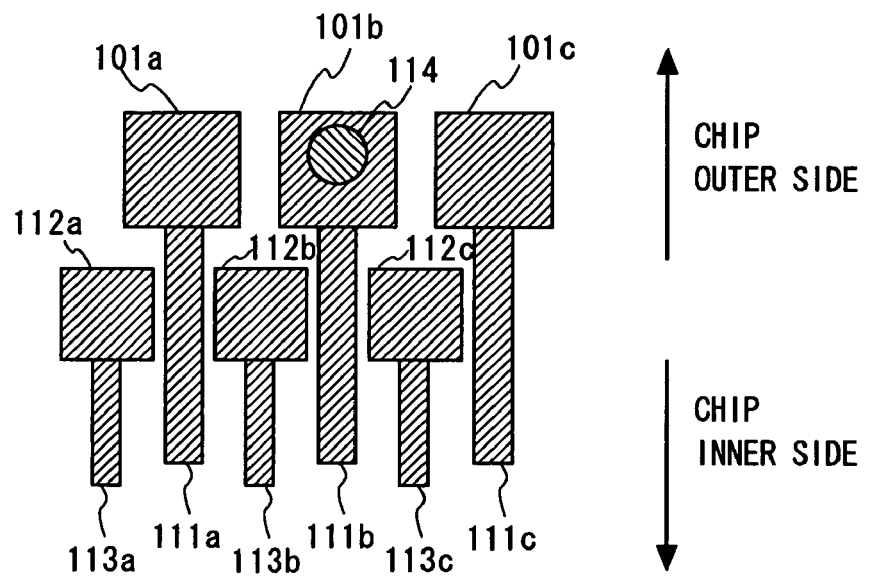
FIG. 11A is a top view of a bonding pad and its vicinity of a conventional semiconductor apparatus.
Figure 11B:
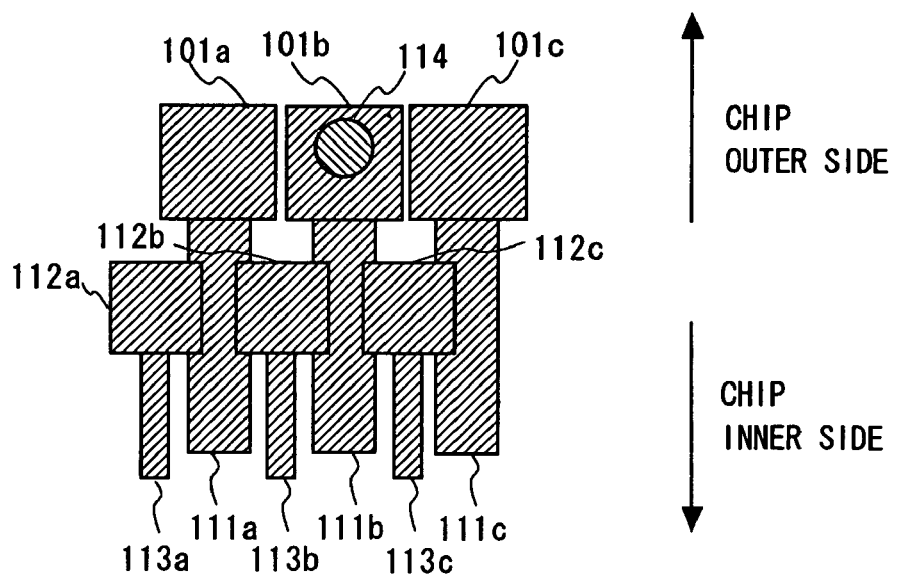
FIG. 11B is a top view of a bonding pad and its vicinity of a conventional semiconductor apparatus.

FIGS. 9A and 9B are top views illustrating the bonding pads 1 and its vicinity of this embodiment. The bonding pads 1 are arranged in a staggered fashion. The bonding pads 1a, 1b, and 1c are arranged as a first pad line in the outer side of the semiconductor chip. The bonding pads 1a, 1b, and 1c are electrically connected to the internal circuit by lead-in lines 91a, 91b, and 91c, respectively. Further, bonding pads 92a, 92b, and 92c are arranged as a second pad line in the inner side of the semiconductor chip. The bonding pads 92a, 92b, and 92c are electrically connected to the internal circuit by lead-in lines 93a, 93b, and 93c, respectively. The interval area between each pad of the first pad line exists next to each pad of the second pad line. The lead-in lines 91a, 91b, and 91c of the first pad line are placed between each pad of the second pad line.

A bonding wire or a probe is connected to the bonding position 5 in the central part of the bonding pad 1b to make an electrical connection between the external electrode and the internal circuit of the semiconductor chip.

FIG. 9A illustrates the case of forming the bonding pads 1a to 1c, the lead-in lines 91a to 91c, the bonding pads 92a to 92c, and the lead-in lines 93a to 93c in the same layer. In this embodiment, the connecting portion 94 makes a bridge connection between the bonding pads 1b and 1c. The connecting portion 94 may be formed in the same or a different layer.

The external electrode and the internal circuit of the semiconductor chip which are bonded together are thereby electrically connected through the bonding pad 1b and the lead-in line 91b, and also through the connecting portion 94, the bonding pad 1c, and the lead-in line 91c. The resistance of the line from the external electrode to the internal circuit therefore decreases, making it possible to prevent power supply voltage drop and signal degradation without changing the position of pads and the width of the lead-in lines.

Though the same effect can be obtained when the bonding pads 92b and 92c do not exist in FIG. 9A, this embodiment is particularly effective when it is impossible to increase the width of the lead-in lines 91a to 91c due to the presence of the bonding pads 92b and 92c and so on.

It is also possible to place the bonding pads 92b and 92c at both sides of the lead-in line 91b in the positions farther from the lead-in line 91b and increase the width of the lead-in line 91b, as shown in FIG. 9B. Specifically, the pitch between the bonding pads 92b and 92c is greater than the pitch between the bonding pads 92a and 92b, and the lead-in line 91b is wider than the lead-in line 91a. The sizes of the bonding pads 92a and 92b are smaller than those of the bonding pads 1a and 1b. The widths of the bonding pads 92a and 92b in the arrangement direction of the pads or in the elongated direction of the side of the semiconductor chip are smaller than those of the bonding pads 1a and 1b. The sectional area of the lead-in line 91b is larger than that of the lead-in line 91a. This structure also reduces the resistance of the line from the external electrode to the internal circuit, thereby preventing power supply voltage drop and signal degradation just like the structure of FIG. 9A. For example, if the lead-in line 91b is a power line for supplying power from outside to internal and the lead-in lines 91a and 91c are lines for inputting or outputting a signal different from power from external to internal, it is possible to prevent voltage drop of the power by increasing the sectional area of the lead-in line 91b.

Further, in FIG. 9B, the bonding pads 92a to 92c are smaller than the bonding pads 1a to 1c. This allows further increasing the width of the lead-in line 91b, thus preventing power supply voltage drop and signal degradation more effectively.

The lead-in line 91b may be in the same layer as the bonding pad 1, in the lower layer than the bonding pad 1, or in a plurality of layers. A plurality of layers can further reduce the resistance of the lead-in line 91b, thus having a greater effect. The lead-in line 91b is preferably in the top layer since the thickness of the top layer can be larger than the lower layers.

As described in the foregoing, the semiconductor apparatus of the third embodiment arranges the bonding pads in a staggered fashion and connects the adjacent pads or increases the width of the lead-in line. This reduces the resistance of the lead-in line, thereby preventing power supply voltage drop or signal deterioration. It is thereby possible to increase power supply capacity and reliability.

This embodiment is applicable not only to the structures of FIGS. 1 to 4, but also to any semiconductor apparatus as long as the structure of FIG. 9 can be made.

Other Embodiments

Although the above embodiments place the bonding pads in the peripheral part of the semiconductor chip 10, it is not limited thereto. The bonding pads may be placed in the central part or in the entire part of the semiconductor chip 10.

Further, though the above embodiments describe the case of using a metal layer as a multi-layer line, another conductive layer may be used instead.

It is apparent that the present invention is not limited to the above embodiment that may be modified and changed without departing from the scope and spirit of the invention.

What is claimed is:

1. A semiconductor apparatus comprising:
    a pad;
    a first line layer placed beneath the pad, such that the pad and the first line layer overlap; and
    a plurality of contacts, arranged as a plurality of intersecting strips as viewed from above, disposed immediately beneath the pad,
    wherein the plurality of contacts comprise:
        a plurality of first linear conductors, disposed parallel to each other in a first direction within the first line layer, and
        a plurality of second linear conductors, disposed parallel to each other in a second direction crossing the first direction, above the first line layer; and
    wherein the pad is disposed on the second conductors.

2. The semiconductor apparatus of claim 1, wherein a bonding position on the pad directly overlaps one of the plurality of contacts.

3. The semiconductor apparatus of claim 1, wherein the pad is electrically connected with a second pad.

4. The semiconductor apparatus of claim 1, further comprising
    a first line connected to the pad and
    a second line connected to a second pad;
    wherein the first line is a power line and a sectional area of the first line connected to the pad is greater than a sectional area of and the second line connected to the second pad.

5. The semiconductor apparatus of claim 1, further comprising:
    a plurality of first pads and a plurality of second pads;
    wherein the plurality of second pads are laterally closer to an edge of the semiconductor apparatus than the plurality of first pads;
    wherein at least one of the plurality of second pads is disposed on one of the plurality of contacts; and
    wherein a lateral width of each of the plurality of first pads is smaller than a lateral width of each of the plurality of second pads.

6. The semiconductor apparatus of claim 1, wherein one of the plurality of contacts is disposed directly beneath a probing position on the pad.

7. The semiconductor apparatus of claim 1, further comprising:
    a second line layer disposed below the first line layer such that the pad and the second line layer overlap;
    wherein a distance between the first line layer and the second line layer is longer than a distance between the pad and the first line layer.

8. The semiconductor apparatus of claim 1, further comprising:
    a second line layer disposed below the first line layer such that the second line layer and the pad overlap; and
    a third line layer disposed below the first line layer such that the third layer and the pad do not overlap;
    wherein a distance between the first line layer and the second line layer is longer than a distance between the first line layer and the third line layer.

9. A semiconductor apparatus comprising:
    a pad;
    a first line layer placed beneath the pad, such that the pad and the first line layer overlap;
    a plurality of contacts, arranged in a lattice as viewed from above, disposed immediately beneath the pad; and
    a second line layer disposed below the first line layer, wherein the second line layer is laterally spaced from the pad such that the pad and the second line layer do not overlap.

10. The semiconductor apparatus of claim 9, further comprising an internal circuit disposed below the first line layer and laterally spaced such that the internal circuit and the pad overlap.

11. The semiconductor apparatus of claim 10, further comprising
    a third line layer, wherein the third line layer is not disposed between the first line layer and the internal circuit.

12. A semiconductor apparatus comprising:
    a pad;
    a first line layer, disposed beneath the pad, comprising a first metal line disposed on the first line layer such that the pad and the first metal line overlap;
    a plurality of contacts, arranged as a plurality of intersecting strips as viewed from above, disposed immediately beneath the pad; and
    a second line layer, disposed below the first line layer, comprising a second metal line disposed on the second line layer such that the pad and the second metal line overlap;
    wherein a distance between the first metal line and the second metal line is longer than a distance between the pad and the first metal line.

13. The semiconductor apparatus of claim 12, further comprising:
    a third line layer, disposed below the first line layer, comprising a third metal line disposed on the third line layer such that the third metal line and the pad do not overlap;
    wherein a distance between the first metal line and the second metal line is longer than a distance between the first metal line and the third metal line.

* * * * *